United States Patent
Nendai et al.

(10) Patent No.: US 9,876,061 B2
(45) Date of Patent: Jan. 23, 2018

(54) ORGANIC LIGHT-EMITTING DEVICE AND ORGANIC DISPLAY APPARATUS

(71) Applicant: JOLED INC., Tokyo (JP)

(72) Inventors: Kenichi Nendai, Tokyo (JP); Nobuto Hosono, Tokyo (JP); Satoshi Kobayashi, Tokyo (JP); Tsuyoshi Yamamoto, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/324,680

(22) PCT Filed: Jun. 29, 2015

(86) PCT No.: PCT/JP2015/003246
§ 371 (c)(1),
(2) Date: Jan. 6, 2017

(87) PCT Pub. No.: WO2016/006194
PCT Pub. Date: Jan. 14, 2016

(65) Prior Publication Data
US 2017/0213880 A1 Jul. 27, 2017

(30) Foreign Application Priority Data
Jul. 9, 2014 (JP) .................. 2014-141292

(51) Int. Cl.
*H01L 51/50* (2006.01)
*H01L 27/32* (2006.01)
(Continued)

(52) U.S. Cl.
CPC ...... *H01L 27/3246* (2013.01); *H01L 51/5056* (2013.01); *H01L 51/5072* (2013.01);
(Continued)

(58) Field of Classification Search
CPC ............. H01L 51/5056; H01L 51/5072; H01L 51/5209; H01L 51/56
See application file for complete search history.

(56) References Cited

U.S. PATENT DOCUMENTS

| 5,443,922 A | 8/1995 | Nishizaki et al. |
| 2007/0132356 A1 | 6/2007 | Hashimoto et al. |
| 2009/0253331 A1 | 10/2009 | Hashimoto et al. |

FOREIGN PATENT DOCUMENTS

| JP | 5-163488 A | 6/1993 |
| JP | 2002-75640 A | 3/2002 |

(Continued)

OTHER PUBLICATIONS

International Search Report in International Patent Application No. PCT/JP2015/003246, dated Sep. 15, 2015.

*Primary Examiner* — Douglas Menz
(74) *Attorney, Agent, or Firm* — Hauptman Ham, LLP

(57) ABSTRACT

Organic light-emitting device including light-emitting portions disposed in two intersecting directions along a substrate main surface. Each light-emitting portion, in a first direction intersecting the substrate main surface, includes first and second electrodes, a charge transport layer, and an organic light-emitting layer, and is partitioned from adjacent light-emitting portions by first banks extending in a third direction being one of the two directions and second banks extending in a second direction being the other of the two directions. Each area between adjacent first banks is covered by the charge transport and organic light-emitting layers extending continuously across the area over the second banks. The first and second banks contain insulating material, a thickness of the second banks is no greater than 20% a height of the first banks, and the second banks have a surface portion contact angle smaller than that of the first banks.

6 Claims, 8 Drawing Sheets

(51) Int. Cl.
  *H01L 51/52*  (2006.01)
  *H01L 51/56*  (2006.01)
(52) U.S. Cl.
  CPC .......... *H01L 51/5209* (2013.01); *H01L 51/56* (2013.01); *H01L 2227/323* (2013.01); *H01L 2251/558* (2013.01)

(56) References Cited

FOREIGN PATENT DOCUMENTS

| JP | 2007-188862 A | 7/2007 |
| JP | 2011-108578 A | 6/2011 |
| JP | 2011-119078 A | 6/2011 |
| JP | 2013-206861 A | 10/2013 |
| JP | 2013-206864 A | 10/2013 |
| JP | 2013-214360 A | 10/2013 |

ORGANIC LIGHT-EMITTING DEVICE AND ORGANIC DISPLAY APPARATUS

RELATED APPLICATIONS

The present application is a National Phase of International Application Number PCT/JP2015/003246, filed on Jun. 29, 2015, which claims priority to Japanese Patent Application Number 2014-141292, filed on Jul. 9, 2014.

TECHNICAL FIELD

The present invention relates to organic light-emitting devices and organic display devices. In particular, the present invention relates to a structure of banks defining a light-emitting portion.

BACKGROUND ART

In recent years, much development is being conducted of organic light-emitting devices, such as organic electroluminescence (EL) panels and organic EL lighting devices (Patent Literature 1). The following describes a structure of a conventional organic EL panel, with reference to FIG. 8A.

The conventional organic EL panel illustrated in FIG. 8A has a substrate 900, a thin film transistor (TFT) layer 901 disposed on one main surface (one of the main surfaces located higher in the Z-axis direction) of the substrate 900, and an insulating layer 902 disposed on the TFT layer 901. The conventional organic EL panel further includes anodes 903 and hole injection layers 904 disposed in this order on the insulating layer 902. Note that a combination of one anode 903 and one hole injection layer 904 is provided for every sub-pixel (light-emitting portion) of the panel.

The conventional organic EL panel further includes second banks 915 that extend in the X-axis direction. Each second bank 915 is disposed on the insulating layer 902, at a gap area including Y-axis direction edges of two anodes 903 and Y-axis direction edges of two hole injection layers 904. The conventional organic EL panel further includes first banks 905 that extend in the Y-axis direction to intersect with the second banks 915.

The conventional organic EL panel further includes, disposed at each area between an adjacent pair of first banks 905, a plurality of organic films. Specifically, the organic films include a hole transport layer 906, an organic light-emitting layer 907, and an electron transport layer 908 disposed in this order. The conventional organic EL panel further includes a cathode 909 and a sealing layer 910 that are disposed in this order to cover the electron transport layer 908 over each area between an adjacent pair of first banks 905 and exposed surfaces of the first banks 905.

Note that while not illustrated in FIG. 8A, the conventional organic EL panel further includes a color filter panel unit that is disposed on the Z-axis direction upper side of the structure illustrated in FIG. 8A via a resin layer.

CITATION LIST

Patent Literature

[Patent Literature 1]
Japanese Patent Application Publication No.: 2002-75640

SUMMARY OF INVENTION

Technical Problem

Meanwhile, the present inventor, in cooperation with one or more others, has found that an organic film, such as a hole transport layer 906 or an organic light-emitting layer 907, may not be formed properly in the conventional organic light-emitting device with the above-described structure. Specifically, the hole transport layer 906 may not be formed properly over an area of an upper surface 915a of a second bank 915 that is indicated by arrow F in FIG. 8B.

Further, the present inventor, in cooperation with one or more others, found that an organic film is likely to be formed improperly, in particular, over an area of an upper surface 915a of a second bank 915 that is near a base portion 905b of a first bank 905. This is illustrated in FIG. 8C, and the area of an upper surface 915a of a second bank 915 over which an organic film is likely to be formed improperly is indicated by arrow G in FIG. 8C.

When an organic film is formed improperly over a second bank 915, there is a risk of the organic film not having a desired thickness in light-emitting portions at both sides of the second bank 915. This may result in low light-emission performance.

The present invention has been made to overcome the technical problem(s) described above, and aims to provide an organic light-emitting device and an organic display device that have high light-emission performance for the risk being suppressed of an organic film being formed improperly at a gap area between adjacent light-emitting portions.

Solution to Problem

One aspect of the present invention is an organic light-emitting device including: a substrate; and light-emitting portions disposed on or above the substrate in a two-dimensional arrangement in two intersecting directions along a main surface of the substrate. The light-emitting portions, in a first direction intersecting the substrate main surface, each include: a first electrode; a charge transport layer; an organic light-emitting layer; and a second electrode.

The first electrode is on or above the substrate. The charge transport layer is on or above the first electrode and is an organic layer. The organic light-emitting layer is on or above the charge transport layer. The second electrode is on or above the organic light-emitting layer.

When defining one of the two directions along the substrate main surface as a second direction and the other one of the two directions as a third direction, an area of each of the light-emitting portions in the second direction is defined by first banks, and an area of each of the light-emitting portions in the third direction is defined by second banks.

The first banks each extend along the substrate main surface and in the third direction.

The second banks each extend along the substrate main surface and in the second direction.

In the organic light-emitting device pertaining to one aspect of the present invention, each area between a pair of adjacent ones of the first banks is covered by the charge transport layer extending continuously across the area over the second banks and the organic light-emitting layer extending continuously across the area over the second banks. Further, the first banks and the second banks each contain an insulating material, a thickness of the second banks is no greater than 20% a height of the first banks, and a contact angle of surface portions of the second banks is smaller than a contact angle of surface portions of the first banks.

Advantageous Effects of Invention

In the organic light-emitting device pertaining to one aspect of the present invention, the first and second banks are defined as described above. Thus, the organic light-emitting device has high light-emission performance for the risk being suppressed of an organic film being formed improperly at a gap area between adjacent light-emitting portions.

DESCRIPTION OF EMBODIMENTS

[Matters Considered by Present Inventor and Others]

Figure 8A:
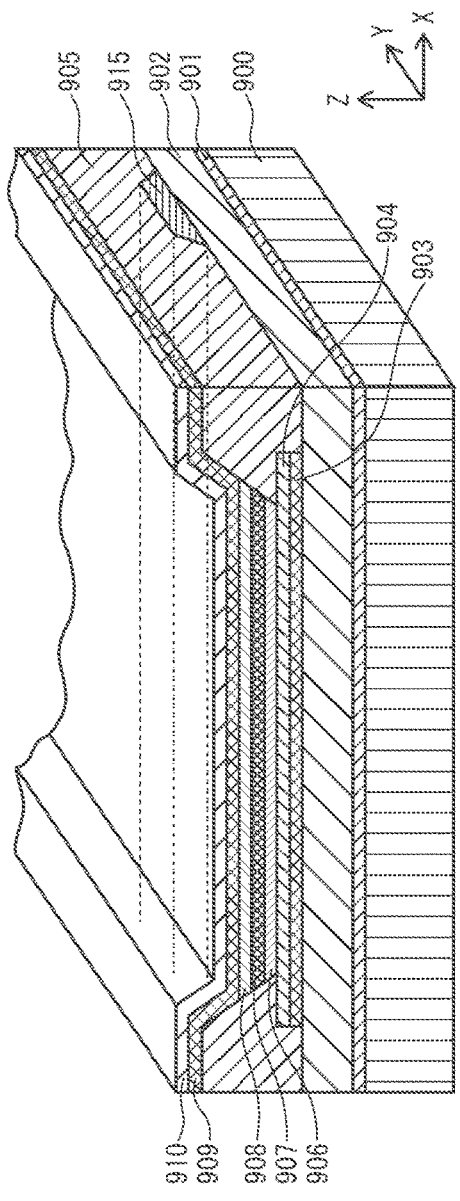
FIG. 8A is a perspective diagram (a cross-sectional diagram) illustrating a part of the structure of a display panel pertaining to conventional technology.

The following describes matters that were considered by the present invention, in cooperation with one or more others, in the process of conceiving various aspects of the present invention, referring to FIGS. 8A through 8C once again.

Figure 8B:
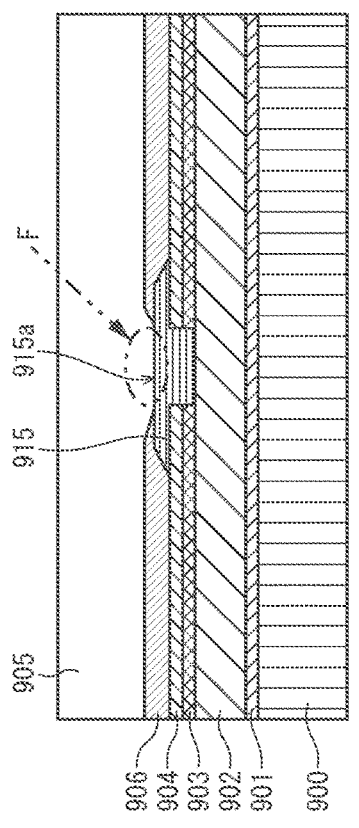
FIG. 8B is a cross-sectional diagram illustrating one example of a hole transport layer 906 not having been formed properly.

As illustrated in FIG. 8B, a second bank 915 is provided to prevent short-circuiting between adjacent anodes 903 and to prevent electric-field light-emission from occurring over an edge portion of an anode 903. Meanwhile, as already described above, an organic film (e.g., a hole transport layer 906 in FIG. 8B) may be formed improperly over an upper surface 915a of a second bank 915.

The present inventor, in cooperation with one or more others, considered this problem of an organic film not being formed properly (due to insufficient wetting with ink for the organic film), and found that the problem was very dependent upon a thickness of the second banks 915 and a surface portion contact angle of the second banks 915. Insufficient wetting with ink for an organic film occurring at an upper surface 915a of a second bank 915 leads to the organic film having different thickness in sub-pixels (light-emitting portions) at both sides of the second bank 915. Such unevenness in organic film thickness may bring about a decrease in light-emission quality.

Figure 8C:
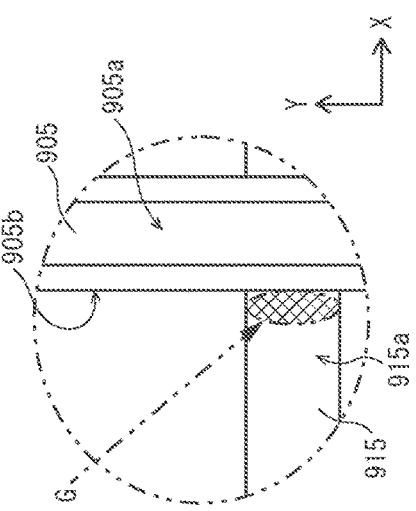
FIG. 8C is a plan view diagram illustrating an area over which an organic film is likely to be formed improperly.

Further, insufficient wetting with ink for forming an organic film is likely to occur at an area of an upper surface 915a of a second bank 915 that is near a base portion 905b of a first bank 905. This is illustrated in FIG. 8C, and the area of an upper surface 915a of a second bank 915 over which an organic film is likely to be formed improperly is indicated by arrow G in FIG. 8C.

[Overview of Aspects of Present Invention]

One aspect of the present invention is an organic light-emitting device including: a substrate; and light-emitting portions disposed on or above the substrate in a two-dimensional arrangement in two intersecting directions along a main surface of the substrate. The light-emitting portions, in a first direction intersecting the substrate main surface, each include: a first electrode; a charge transport layer; an organic light-emitting layer; and a second electrode.

The first electrode is on or above the substrate. The charge transport layer is on or above the first electrode and is an organic layer. The organic light-emitting layer is on or above the charge transport layer. The second electrode is on or above the organic light-emitting layer.

When defining one of the two directions along the substrate main surface as a second direction and the other one of the two directions as a third direction, an area of each of the light-emitting portions in the second direction is defined by first banks, and an area of each of the light-emitting portions in the third direction is defined by second banks.

The first banks each extend along the substrate main surface and in the third direction.

The second banks each extend along the substrate main surface and in the second direction.

The first banks are spaced away from one another in the second direction, and the second banks are spaced away from one another in the third direction.

In the organic light-emitting device pertaining to one aspect of the present invention, each area between a pair of adjacent ones of the first banks is covered by the charge transport layer extending continuously across the area over the second banks and the organic light-emitting layer extending continuously across the area over the second banks. Further, the first banks and the second banks each contain an insulating material, a thickness of the second banks is no greater than 20% a height of the first banks, and a contact angle of surface portions of the second banks is smaller than a contact angle of surface portions of the first banks.

The organic light-emitting device pertaining to one aspect of the present invention has a structure defined based on the above-described considerations. Specifically, the thickness of the second banks is defined to be no greater than 20% the height of the first banks, and a surface portion contact angle of the second banks is defined to be 5° or smaller. Due to this, in the organic light-emitting device pertaining to one aspect of the present invention, the risk is low of insufficient wetting with ink for an organic film occurring at upper surfaces of the second banks. Specifically, defining the thickness of the second banks to be no greater than 20% the height of the first banks ensures that each first bank has sufficient height at areas where the first bank intersects with second banks, and thus, is advantageous in terms of repelling ink applied. That is, when the second banks have a thickness greater than that defined above, the first banks would not have sufficient height at areas where the first banks intersect with second banks. This leads to insufficient repelling of ink applied. Meanwhile, defining the thickness of the second banks to be no greater than 20% the height of the first banks ensures that the first banks sufficiently repel ink at all areas thereof, including the areas where the first banks intersects with second banks.

Further, by defining the surface portion contact angle of the second banks to be 5° or smaller, the risk of insufficient wetting with ink for an organic film can be suppressed without having to excessively increase the quantity of ink droplets applied.

Thus, the organic light-emitting device pertaining to one aspect of the present invention has high light-emission performance for the risk being suppressed of an organic film being formed improperly at a gap area between adjacent light-emitting portions.

Another aspect of the present invention is the organic light-emitting device pertaining to one aspect wherein an end portion of the first electrode has a flat area extending along the substrate main surface, the second banks have a portion covering the flat area of the first electrode, and the thickness of the second banks is a thickness of the portion covering the flat area of the first electrode. Defining the thickness of the second banks in such a manner suppresses the risk of insufficient wetting with ink for an organic film.

Another aspect of the present invention is the organic light-emitting device pertaining to one aspect wherein the contact angle of surface portions of the second banks is a contact angle with respect to ink for forming the charge transport layer.

Another aspect of the present invention is the organic light-emitting device pertaining to one aspect wherein the thickness of the second banks is 800 nm or smaller. Note that the minimum of the thickness of the second banks differs depending upon the second bank material used. In any case, the minimum of the thickness of the second banks is a thickness that ensures that the second banks achieve their purposes; i.e., preventing short-circuiting between adjacent anodes and preventing electric-field light-emission over anode edges.

Another aspect of the present invention is the organic light-emitting device pertaining to one aspect wherein the contact angle of surface portions of the second banks is 5° or smaller.

Another aspect of the present invention is an organic display device including a display panel; and a control and drive circuit unit that is connected to the display panel, wherein the display panel has the device structure of the organic light-emitting device pertaining to one of the above-described aspects. This structure achieves high light-emission quality (display quality) for the reasons discussed above.

Embodiment

The following describes the structure of an organic EL display device 1 pertaining to an embodiment, with reference to the accompanying drawings.

1. Overall Structure

Figure 1:
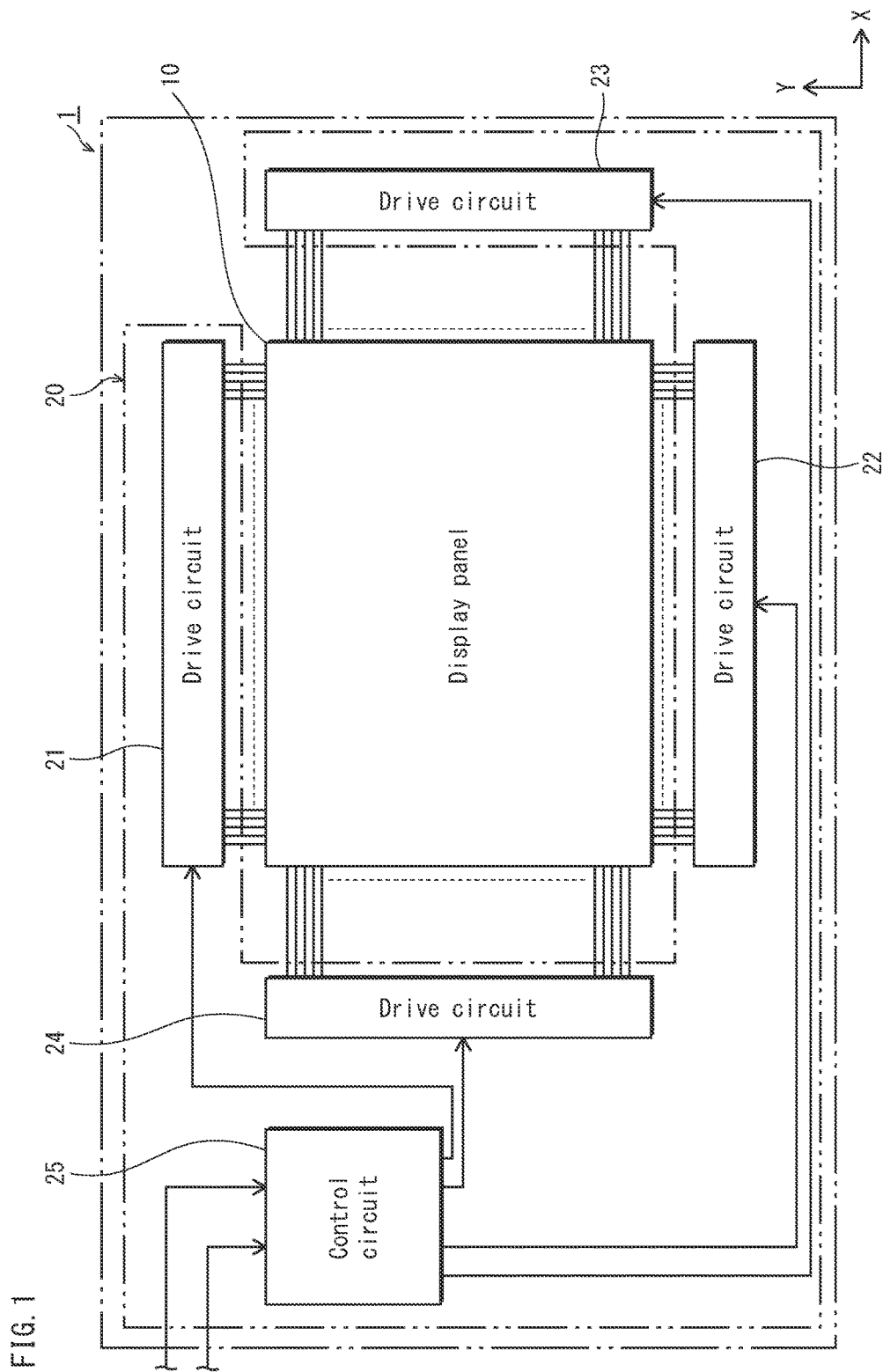
FIG. 1 is a schematic block diagram illustrating the overall structure of an organic EL display device 1 pertaining to an embodiment of the present invention.
Figure 2:
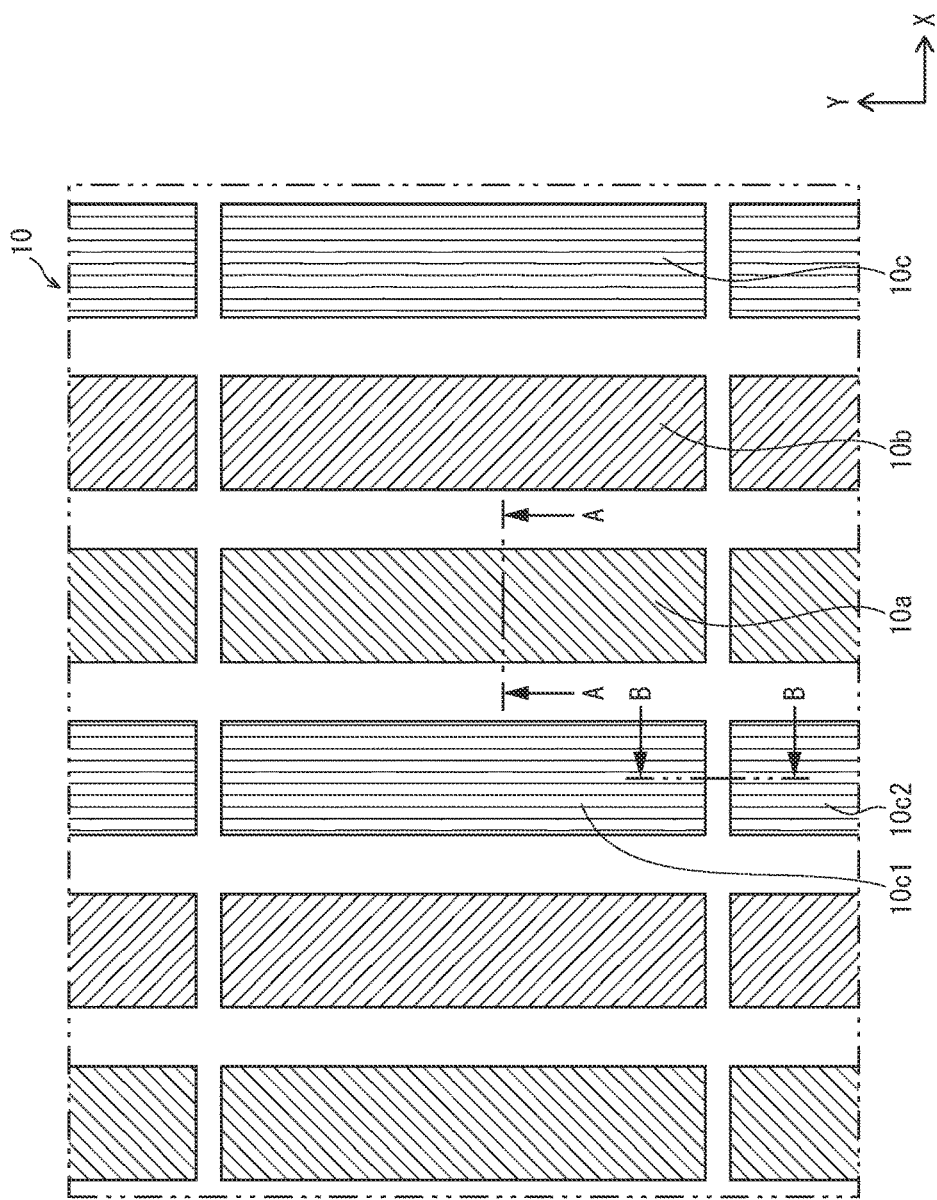
FIG. 2 is a schematic plan view diagram illustrating an arrangement of sub-pixels 10a, 10b, 10c, $10c_1$ and $10c_2$ in a display panel 10.

The following describes the overall structure of the organic EL display device 1 pertaining to the present embodiment, with reference to FIGS. 1 and 2.

As illustrated in FIG. 1, the organic EL display device 1 pertaining to the present embodiment is an organic EL display device including a display panel 10 and a drive and control circuit unit 20 connected to the display device 1. The display device 10 is one type of an organic light-emitting device, and specifically, is an organic EL panel utilizing the electric-field light-emission phenomenon of organic material.

As illustrated in FIG. 2, the display panel 10 has sub-pixels 10a, sub-pixels 10b, sub-pixels 10c (including a sub-pixel $10c_1$ and a sub-pixel $10c_2$). The sub-pixels 10a through 10c are arranged in a two-dimensional arrangement in the X-axis and Y-axis directions. The present embodiment is based on an example where each sub-pixel 10a is a light-emitter emitting red (R) light, each sub-pixel 10b is a light-emitter emitting green (G) light, and each sub-pixel 10c is a light-emitter emitting blue (B) light. Further, a set of one sub-pixel 10a, one sub-pixel 10b, and one sub-pixel 10c that are adjacent to one another in the X-axis direction composes one pixel.

Referring to FIG. 1 once again, the drive and control circuit unit 20 includes four drive circuits, namely drive circuits 21, 22, 23, and 24, and a control circuit 25. Note that in the organic EL display device 1, the display panel 10 and the drive and control circuit unit 20 need not be arranged with respect to one another as illustrated in FIG. 1.

Further, each pixel need not be composed of a set of three sub-pixels 10a, 10b, and 10c as illustrated in FIG. 2, and instead, may be composed of a set of four or more sub-pixels.

2. Structure of Display Panel 10

Figure 3:
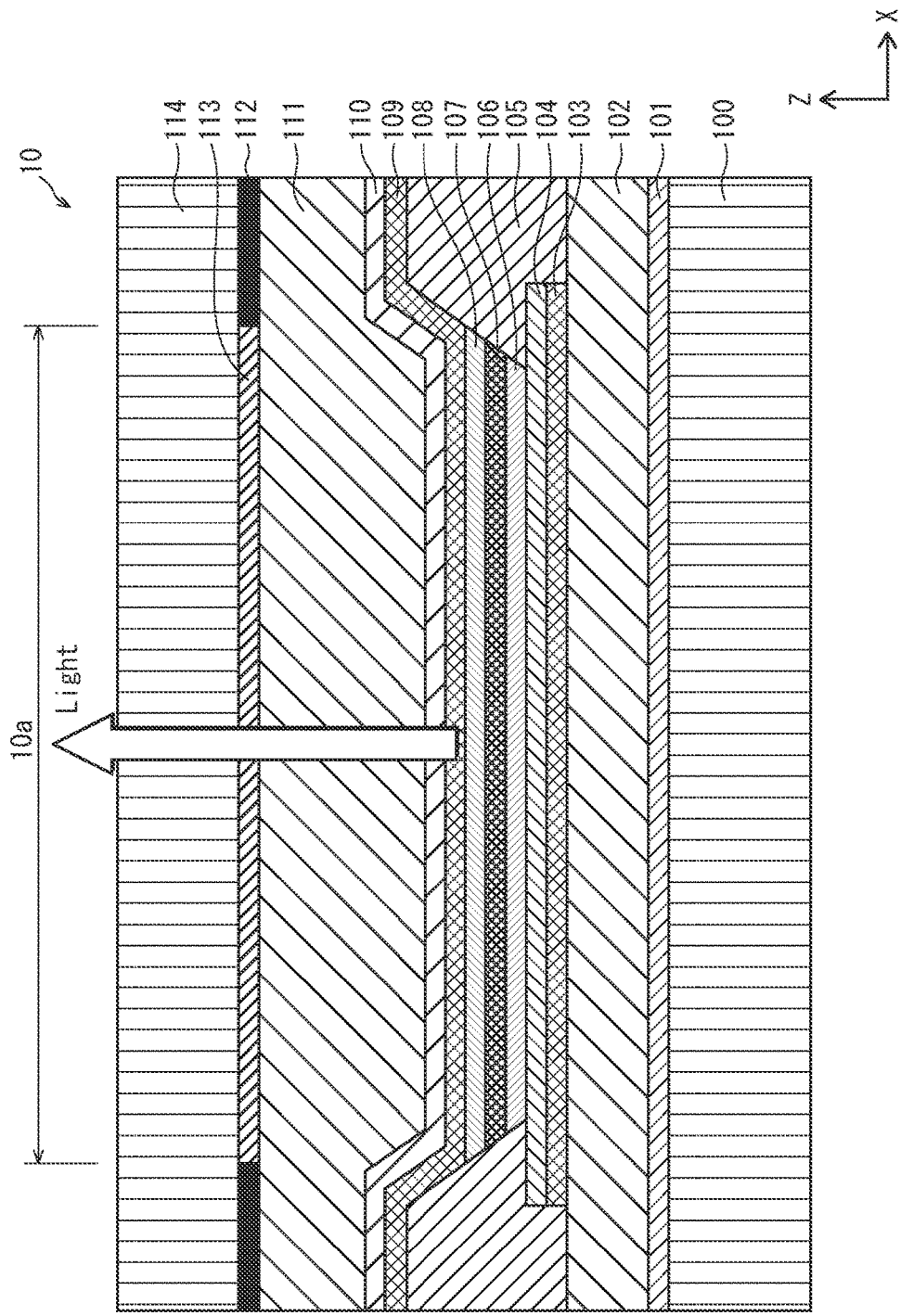
FIG. 3 is a schematic cross-sectional diagram illustrating the structure of an A-A cross-section in FIG. 2.
Figure 4:
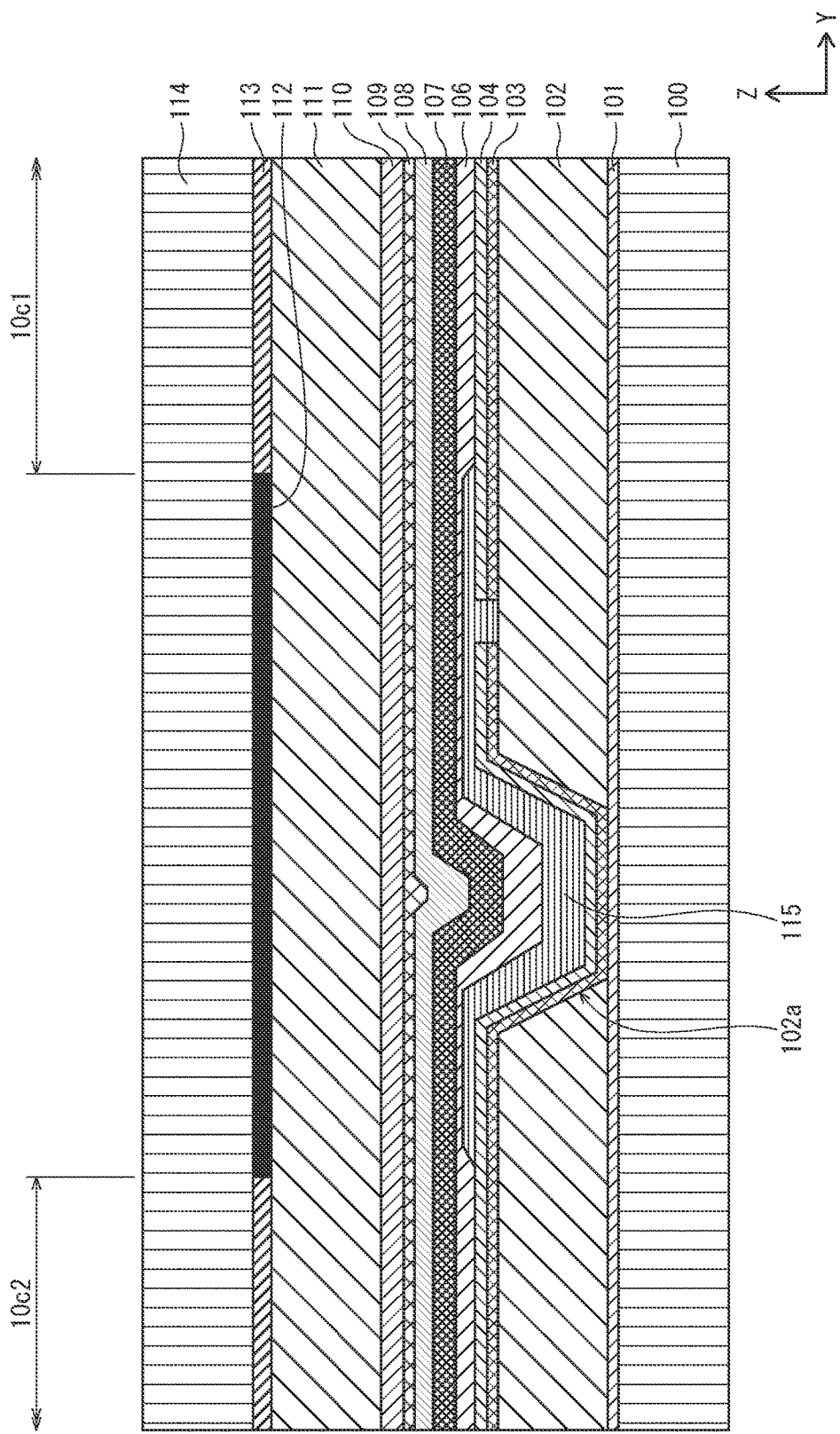
FIG. 4 is a schematic cross-sectional diagram illustrating the structure of a B-B cross-section in FIG. 2.

The following describes the structure of the display panel 10, with reference to FIGS. 3 and 4. FIG. 3 illustrates a cross-section taken along line A-A in FIG. 2, and FIG. 4 illustrates a cross-section taken along line B-B in FIG. 2.

As illustrated in FIG. 3, a sub-pixel 10a in the display panel 10 has a structure where a plurality of functional layers are disposed between two substrates, namely a substrate 100 and a substrate 114.

The substrate 100, which is the substrate located lower in the Z-axis direction, has a TFT layer 101 disposed thereon. The TFT layer 101 is not illustrated in drawings such as FIG. 3. The TFT layer 101 is a thin-film transistor layer having a conventional structure. A combination of an anode 103 and a hole injection layer 104 is disposed above the TFT layer 101 in this order from down to up in the Z-axis direction. Further, an insulating layer 102 is disposed between the TFT layer 101 and the combination of the anode 103 and the hole injection layer 104.

Further, first banks 105 are disposed to cover the insulating layer 102 and X-axis direction edge portions of the hole injection layer 104. The first banks 105 define the X-axis direction area of the sub-pixel 10a.

Inside an opening whose X-axis direction ends are defined by the first banks 105, a hole transport layer 106, an organic light-emitting layer 107, and an electron transport layer 108 are disposed in this order from down to up in the Z-axis direction.

Further, a cathode 109 and a sealing layer 110 are disposed in this order from down to up in the Z-axis direction to cover the electron transport layer 108 and top surfaces of the first banks 105.

Meanwhile, a color filter layer 113 and black matrix layers 112 are disposed on an Z-axis direction lower main surface of the substrate 114, which is the substrate located higher in the Z-axis direction.

A resin layer 111 is disposed between the sealing layer 110 and the color filter 113 and between the sealing layer 110 and the black matrix layers 112. The resin layer 111 is in gapless close contact with each of the sealing layer 110, the color filter layer 113, and the black matrix layers 112.

The display panel 10 pertaining to the present embodiment is a top-emission display panel, and thus emits light upwards in the Z-axis direction as shown by the arrow in FIG. 3.

The rest of the sub-pixels of the display panel 10 (i.e., the sub-pixels 10b and 10c (10$c_1$ and 10$c_2$)) also have structures similar to the structure described above.

Meanwhile, FIG. 4 illustrates a non-light-emitting area between sub-pixels 10$c_1$ and 10$c_2$ that are adjacent in the Y-axis direction. At the non-light-emitting area, the insulating layer 102 has a contact hole 102a. The contact hole 102a is for connecting an anode 103 of one sub-pixel (the sub-pixel 10$c_2$ in FIG. 4) with a source electrode or a drain electrode of the TFT layer 101. Specifically, the anode 103 of the sub-pixel 10$c_2$ and the source or drain electrode of the TFT layer 101 are connected at the bottom of the contact hole 102a.

Further, at the non-light-emitting area, a second bank 115 is disposed. The second bank 115 covers end portions of two anodes 103 and end portions of two hole injection layers 104. Here, an end portion of an anode 103/hole injection layer 104 includes the edge of the layer. Further, the second bank 115 has a portion that is embedded inside the contact hole 102a.

Note that in the display panel 10, each organic film, such as the hole transport layer 106, the organic light-emitting layer 107, and the electron transport layer 108, extends continuously in the Y-axis direction in each area between an adjacent pair of first banks 105, extending over second banks 115.

3. Materials of Components of Display Panel 10

(1) Substrate 100

The substrate 100 is formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate.

When using a plastic substrate, the plastic substrate may be formed by using a thermoplastic resin or a thermosetting resin. For example, usable resins include polyolefin (e.g., polyethylene, polypropylene, ethylene-propylene copolymer, ethylene-vinyl acetate copolymer (EVA)), cyclic polyolefin, denatured polyolefin, polyvinyl chloride, polyvinylidene chloride, polystyrene, polyamide, polyimide (PI), polyamide-imide, polycarbonate, poly-(4-methylpentene-1), ionomer, acrylic resin, polymethyl methacrylate, acrylic-styrene copolymer (AS resin), butadiene-styrene copolymer, ethylene-vinyl alcohol copolymer (EVOH), polyester (e.g., polyethylene terephthalate (PET), polybutylene terephthalate, polyethylene naphthalate (PEN), polycyclohexane terephthalate (PCT)), polyether, polyether ketone, polyether sulfone (PES), polyether imide, polyacetal, polyphenylene oxide, denatured polyphenylene oxide, polyarylate, aromatic polyester (e.g., liquid crystal polymer), fluoro resin (e.g., polytetrafluoroethylene, polyfluorovinylidene), thermoplastic elastomer (e.g., styrene-based elastomer, polyolefin-based elastomer, polyvinylchloride-based elastomer, polyurethane-based elastomer, fluororubber-based elastomer, chlorinated polyethylene-based elastomer), epoxy resin, phenolic resin, urea resin, melamine resin, unsaturated polyester, silicone resin, or polyurethane, or a copolymer, a blended body or a polymer alloy each having at least one of these materials as a major component thereof, and the plastic substrate may be a laminate of one or more of these materials.

(2) TFT Layer 101

The TFT layer 101 includes at least one transistor element portion per sub-pixel. Each transistor element portion includes three electrodes (i.e., the gate, source, and drain electrodes), a semiconductor layer, and a passivation layer.

(3) Insulating Layer 102

The insulating layer 102 is formed by using, for example, an organic compound such as polyimide, polyamide, or an acrylic resin. Further, the insulating layer 102 preferably has resistance against organic solvents.

Further, in the manufacturing process, processing such as etching and baking may be performed with respect to the insulating layer 102. Taking this into account, the insulating layer 102 is preferably formed by using a material having high resistance against such processing and thus does not undergo excessive deformation, deterioration, and the like in such processing.

(4) Anodes 103

The anodes 103 are formed by using a metal material containing silver (Ag) or aluminum (Al). In the display panel 10, which is a top-emission-type panel, the anodes 103 preferably have high optical reflectivity at surface portions thereof.

The anodes 103 need not be composed of a single layer formed by using the above-described metal material. For example, the anodes 103 may be a laminate of a metal layer and a light-transmissive, electrically-conductive layer. In this case, the light-transmissive, electrically-conductive layer may be formed by using, for example, indium tin oxide (ITO) or indium zinc oxide (IZO).

(5) Hole Injection Layers 104

For example, the hole injection layers 104 are formed by using an oxide of a material such as silver (Ag), molybdenum (Mo), chromium (Cr), vanadium (V), tungsten (W), nickel (Ni), or iridium (Ir), or an electrically-conductive polymer material such as polyethylenedioxythiophene (PEDOT; mixture of polythiophene and polystyrene sulfonic acid).

The hole injection layers 104, when formed by using a metal oxide among the materials described above, have a greater work function compared to the hole injection layers 104, when formed by using an electrically-conductive polymer material such as PEDOT, and have functions of assisting the generation of holes and stably injecting holes to the organic light-emitting layers 107.

Further, the hole injection layers 104, when formed by using an oxide of a transition metal, have multiple energy levels due to oxides of transition metals having multiple oxidation states. This results in the hole injection layers 104 readily performing hole injection and thus achieving a reduction in driving voltage. In particular, forming the hole injection layers 104 by using tungsten oxide (WO$_x$) is beneficial, in order to provide the hole injection layers 104 with the functions of stable hole injection and hole generation assistance.

(6) First Banks 105

The first banks 105 are formed by using an organic material such as a resin, and have an insulating property. Examples of organic materials usable for forming the first banks 105 include an acrylic resin, a polyimide resin, and a novolac type phenolic resin. Further, surfaces of the first banks 105 may be treated with fluorine, in which case the surfaces of the first banks 105 are provided with liquid repellency.

Further, the first banks 105 need not be composed of a single layer as illustrated in FIGS. 3 and 4, and instead may be composed of two or more layers. When configuring the first banks 105 to have such a multi-layer structure, the layers may each contain a combination of the materials described above, or the layers may include one or more layers containing inorganic material and one or more layers containing organic material.

(7) Second Banks 115

The second banks 115 may be formed by using, for example, an inorganic insulating material such as silicon oxide ($SiO_2$), silicon nitride (SiN), or silicon oxynitride (SiON), or an organic insulating material.

Specific examples of organic insulating materials usable for forming the second banks 115 include acrylic resin, polyimide resin, siloxane resin, and phenolic resin.

(8) Hole Transport Layers 106

The hole transport layer 106 are made by using a high molecular compound without any hydrophilic groups. For example, the hole transport layers 106 may be formed by using a high molecular compound, such as polyfluorene or a derivative thereof or polyarylamine or a derivative thereof, without any hydrophilic groups.

(9) Organic Light-Emitting Layers 107

The organic light-emitting layers 107 are put in excitation state when holes and electrons are injected and recombine therein, and emit light in this excitation state. The organic light-emitting layers 107 are beneficially formed by using an organic material which has a light-emitting property and a film of which can be formed through wet printing.

For example, the organic light-emitting layers 107 are preferably formed by using one of the fluorescent materials disclosed in Japanese Patent Application Publication No. H05-163488, which include: an oxinoid compound; a perylene compound; a coumarin compound; an azacoumarin compound; an oxazole compound; an oxadiazole compound; a perinone compound; a pyrrolo-pyrrole compound; a naphthalene compound; an anthracene compound; a fluorene compound; a fluoranthene compound; a tetracene compound; a pyrene compound; a coronene compound; a quinolone compound; an azaquinolone compound; a pyrazoline derivative and a pyrazolone derivative; a rhodamine compound; a chrysene compound; a phenanthrene compound; a cyclopentadiene compound; a stilbene compound; a diphenylquinone compound; a styryl compound; a butadiene compound; a dicyanomethylene pyran compound; a dicyanomethylene thiopyran compound; a fluorescein compound; a pyrylium compound; a thiapyrylium compound; a selenapyrylium compound; a telluropyrylium compound; an aromatic aldadiene compound; an oligophenylene compound; a thioxanthene compound; a cyanine compound; an acridine compound; a metal complex of an 8-hydroxyquinoline compound; a metal complex of a 2-bipyridine compound; a complex of a Schiff base and a group III metal; a metal complex of oxine; and rare earth metal complex.

(10) Electron Transport Layers 108

The electron transport layers 108 have the function of transporting electrons injected from the cathode 109 to the organic light-emitting layers 107. The electron transport layers 108 are formed, for example, by using an oxidiazole derivative (OXD), a triazole derivative (TAZ), or a phenanthroline derivative (BCP, Bphen).

(11) Cathode 109

The cathode 109 is, for example, formed by using indium tin oxide (ITO) or indium zinc oxide (IZO). In the display panel 10, which is a top-emission-type panel, it is beneficial to form the cathode 109 by using a material having optical transmissivity. Further, the cathode 109 preferably has an optical transmittance of 80% or higher.

(12) Sealing Layer 110

The sealing layer 110 prevents organic layers such as the organic light-emitting layers 106 from being exposed to moisture, ambient air, etc. For example, the sealing layer 110 is formed by using a material such as SiN or SiON. Further, the sealing layer 110 may include, in addition to a layer formed by using SiN or SiON, a sealing resin layer formed by using a resin material such as acrylic resin or silicone resin.

In the display panel 10, which is a top-emission-type panel, it is necessary to form the sealing layer 110 by using a material having optical transmissivity.

(13) Resin Layer 111

For example, the resin layer 111 is formed by using an optically transmissive resin material such as an epoxy resin material. Alternatively, the resin layer 111 may be formed by using silicone resin or the like.

(14) Black Matrix Layers 112

The black matrix layers 112 are, for example, formed by using an ultraviolet curing resin material containing black pigment that absorbs light excellently and achieves an excellent light blocking effect. One specific example of such ultraviolet curing resin material is acrylic resin.

(15) Color Filter Layers 113

The color filter layers 113 of the colors red (R), green (G), and blue (B) are formed by using conventional materials selectively allowing visible light of a wavelength region of the corresponding color to pass through. For example, the color filter layers 113 may be formed by using acrylic resin as a base material.

(16) Substrate 114

Similar to the substrate 100, the substrate 114 is formed by using, for example, a glass substrate, a quartz substrate, a silicon substrate, a metal substrate made of a metal such as molybdenum sulfide, copper, zinc, aluminum, stainless steel, magnesium, iron, nickel, gold, or silver, a semiconductor substrate made of a semiconductor such as gallium arsenide, or a plastic substrate. Similar to the substrate 100, when using a plastic substrate for the substrate 114, the plastic substrate may be formed by using a thermoplastic resin or a thermosetting resin.

4. Shapes of First Banks 105 and Second Banks 115

Figure 5A:
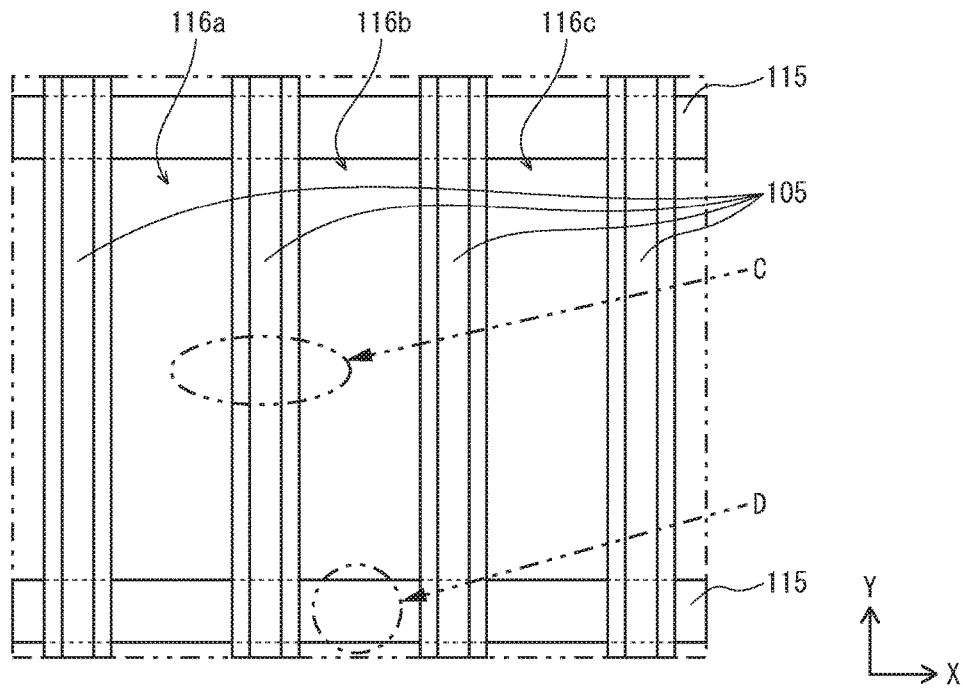
FIG. 5A is a schematic plan view diagram illustrating an arrangement of banks 105 and banks 115 in the display panel 10.
Figure 5B:
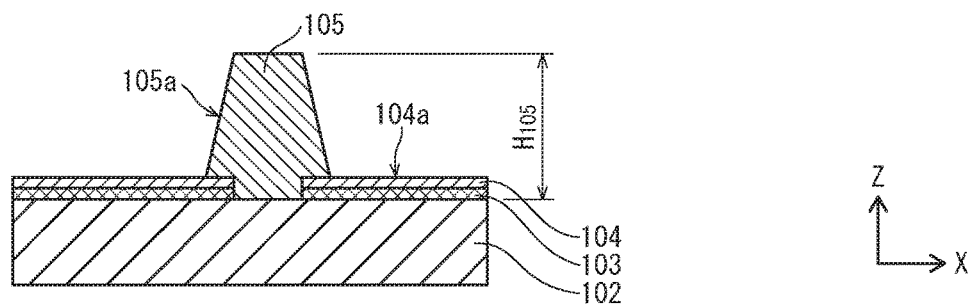
FIG. 5B is a schematic cross-sectional diagram illustrating an area in FIG. 5A indicated by arrow C.
Figure 5C:
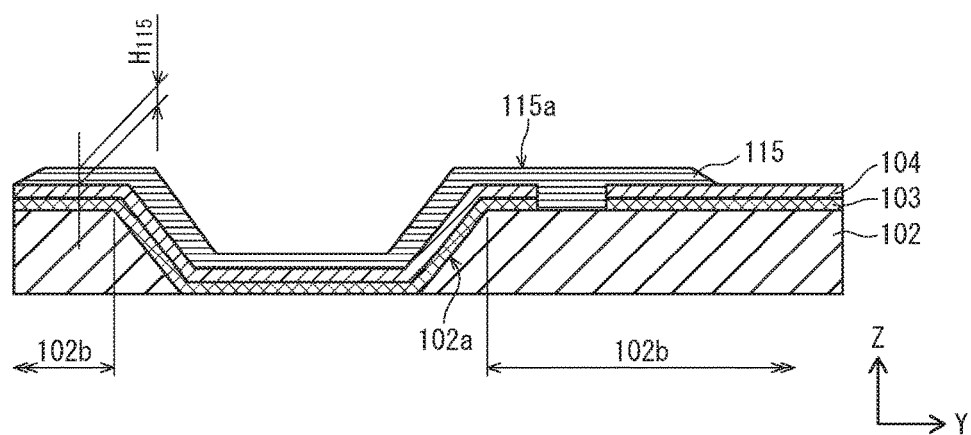
FIG. 5C is a schematic cross-sectional diagram illustrating an area in FIG. 5A indicated by arrow D.

The following describes the shapes of the first banks 105 and the second banks 115, with reference to FIGS. 5A through 5C.

In the display panel 10, the linear first banks 105 extend in the Y-axis direction and are spaced away from one another, as illustrated in FIG. 5A.

Similarly, the linear second banks 115 extend in the X-axis direction and are spaced away from one another.

Further, each area defined by a pair of adjacent first banks 105 and a pair of adjacent second banks 115 is a sub-pixel formation area in which a sub-pixel is to be formed. For example, FIG. 5A illustrates sub-pixel formation areas 116a, 116b, and 116c. Nota that in the present embodiment, before the forming of the hole transport layers 106, the sub-pixel formation areas 116a through 116c expose hole injection layers 104.

As illustrated in FIG. 5A, wherever a first bank 105 and a second bank 115 intersect, the first bank 105 is on the second bank 115. Further, a first bank 105 has a height $H_{105}$ from the Z-axis direction upper surface of the insulating layer 102, as illustrated in FIG. 5B.

Further, surfaces of a first bank 105, including a surface portion 105a, are subjected to treatment for providing liquid repellency. Further, before the forming of the hole transport layers 106, the sub-pixel formation areas 116a through 116c expose surfaces 104a of hole injection layers 104. The surfaces 104a have liquid philicity.

Meanwhile, as illustrated in FIG. 5C, a second bank 115 has a portion inside a contact hole 102a of the insulating layer 102. Due to this, in the following, a thickness $H_{115}$ of a second bank 115 over a portion 102b of the insulating layer 102 where the upper surface of the insulating layer 102 is substantially flat is used as the thickness of the second bank 115. This is since the thickness of the portion of the second bank 115 inside the contact hole 102a changes depending upon location.

In the present embodiment, the thickness $H_{115}$ of the second banks 115 is 800 nm or smaller, and thus, is no greater than 20% the height $H_{105}$ of the first banks 105. Defining the thickness $H_{115}$ of the second banks 115 to be no greater than 20% the height $H_{105}$ of the first banks 105 ensures that each first bank 105 has sufficient height at areas where the first bank 105 intersects with second banks 115. That is, when the second banks 115 have a thickness greater than that defined above, the height $H_{105}$ of the first banks 105 would not be sufficient where the first banks 105 intersect with the second banks 115. This leads to insufficient repelling of ink applied. Meanwhile, defining the thickness $H_{115}$ of the second banks 115 to be no greater than 20% the height of the first banks ensures that the first banks 105 sufficiently repel ink at all areas thereof, including the areas where the first banks 105 intersects with second banks 115. Accordingly, defining the thickness $H_{115}$ of the second banks 115 as described above eliminates the risk of ink for an organic film flowing over the first banks 105 into adjacent areas, and thus achieves high light-emission performance.

Further, surface portions 115a of the second banks 115 have lower liquid repellency than surface portions 105a of the first banks 105. Specifically, a contact angle of surface portions 115a of the second banks 115 is 5° or smaller, and thus, is smaller than a contact angle of surface portions 105a of the first banks 105 (in particular, a surface portion contact angle of upper portions of first banks 105).

By defining the surface portion contact angle of the second banks 115 to be 5° or smaller, the risk of insufficient wetting with ink for an organic film over the second banks 115 can be suppressed without having to excessively increase the quantity of ink droplets applied, for example in the forming of the hole transport layers 106. Thus, high light-emission performance can be achieved.

5. Manufacturing Method of Display Panel 10

Figure 6:
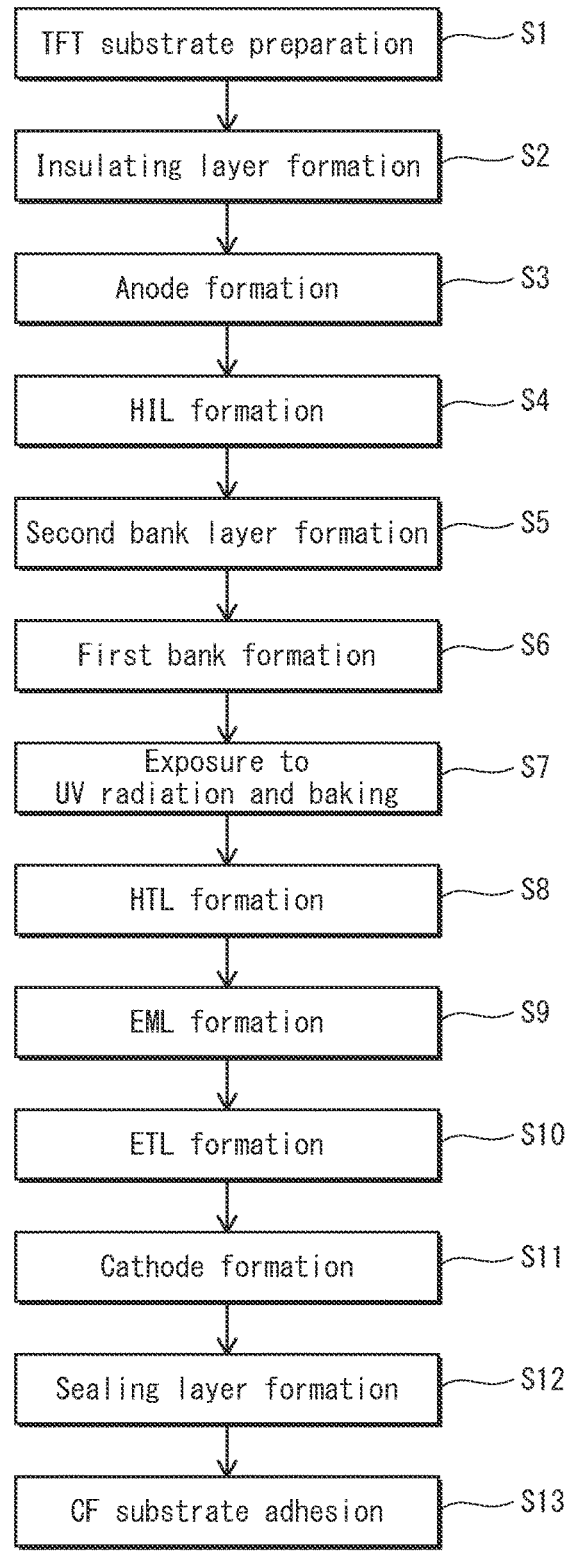
FIG. 6 is a schematic diagram illustrating manufacturing procedures of the display panel 10.

The following provides an overview of a manufacturing method of the display panel 10 pertaining to the present embodiment, with reference to FIG. 6.

FIG. 6 illustrates manufacturing procedures of the display panel 10 in which first, a TFT substrate is prepared (Step S1). The TFT substrate is prepared by forming the TFT layer 101 on the upper surface of the substrate 100, and the preparation is performed through application of conventional technology.

Subsequently, the insulating layer 102 is formed on the TFT substrate (Step S2). For example, the forming of the insulating layer 102 is performed by first applying an organic material onto the passivation film of the TFT layer 101, then flattening and hardening the surface of the applied organic material, and finally forming contact holes 102a.

Subsequently, the forming of the anodes 103 on the insulating layer 102 and the forming of the hole injection layers 104 above the insulating layer 102 are performed in the stated order (Steps S3 and S4). In the forming of the anodes 103, first, a metal film is formed through sputtering or vacuum vapor deposition, and then the metal film having been formed is patterned through photolithography or etching. While not illustrated in any of the drawings, each of the anodes 103 is electrically connected to an upper electrode (electrode connected to a source electrode or a drain electrode) of the TFT layer 101 via a contact hole 102a in the insulating layer 102.

The forming of the hole injection layers 104 includes, for example, forming a metal oxide film (for example, a tungsten oxide film) through sputtering, and then patterning the metal oxide film through photolithography and etching into portions corresponding to the sub-pixels 10a, 10b, and 10c.

Subsequently, the second banks 115 are formed (Step S5). For example, in the forming of the second banks 115, first, a film of a material (e.g., photosensitive acrylic resin material) for the second banks 115 is formed through spin-coating. Then, this resin film is patterned through exposure and developing.

Subsequently, the first banks 105 are formed in a similar manner (Step S6). For example, in the forming of the first banks 105, first, a film of a material (e.g., photosensitive resin material) for the first banks 105 is formed through spin-coating to extend over the entire substrate 100 having the second banks 115 formed thereon. Then, similar to the forming of the second banks 115, this resin film is patterned through exposure and developing.

Subsequently, exposure to ultraviolet (UV) radiation and baking are performed of the first banks 105 and the second banks 115 formed as described above (Step S7). The exposure to UV radiation is performed, for example, for 150 to 200 seconds. The baking is performed, for example, at a temperature of 230 degrees Celsius for 10 to 20 minutes.

This exposure to UV radiation brings about a temporary increase in surface portion contact angle of both the first banks 105 and the second banks 115, but the subsequent baking brings about a decrease in surface portion contact angle. This increase and decrease in surface portion contact angle is considered to occur since the exposure to UV radiation of a film causes fluorine in the film to decompose and emerge to the surface of the film, and the baking then causes excess fluorine to decompose.

The contact angle of the first banks 105, as well as the contact angle of the second banks 115, changes as described above. However, since the first banks 105 have greater contact angle than the second banks 115 in the first place due to the material used, the contact angle of the first banks 105 remains appropriate relative to the contact angle of the second banks 115 before and after the change.

Subsequently, in each groove area defined by a pair of adjacent first banks 105, a hole transport layer 106 is formed (Step S8). In the forming of the hole transport layers 106, an ink containing material for the hole transport layers 106 is applied to each groove area between adjacent first banks 105 through printing (ink application), and then baking of the applied ink is performed.

Subsequently, the forming of the organic light-emitting layer 107 in each groove area between adjacent first banks 105 is performed (Step S9), and then, the forming of the electron transport layer 108 in each groove area between adjacent first banks 105 is performed (Step S10). The forming of the organic light-emitting layers 107 and the forming of the electron transport layers 108 are each performed in a manner similar to the forming of the hole transport layers 106, through application of an ink containing the material for the target layer, and baking the applied ink.

Subsequently, the cathode 109 and the sealing layer 110 are formed in the stated order to cover the electron transport layers 108 and the top surfaces of the first banks 105 (Steps S11, S12). For example, the cathode 109 and the sealing layer 110 are each formed through sputtering.

Subsequently, adhesion of a color filter substrate prepared by forming color filter layers 113 and black matrix layers 112 on the substrate 114 is performed (Step S13). This completes the manufacturing of the display panel 10.

6. Consideration of Contact Angle of Second Banks 115

Figure 7A:
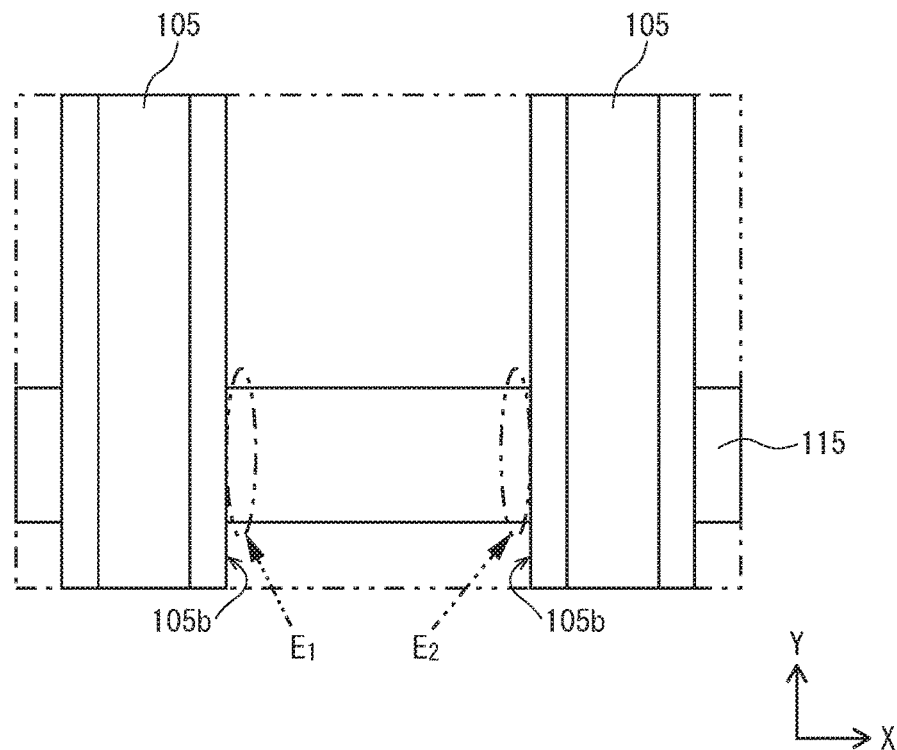
FIG. 7A is a schematic plan view diagram illustrating areas where a second bank 115 intersects with first banks 105.
Figure 7B:
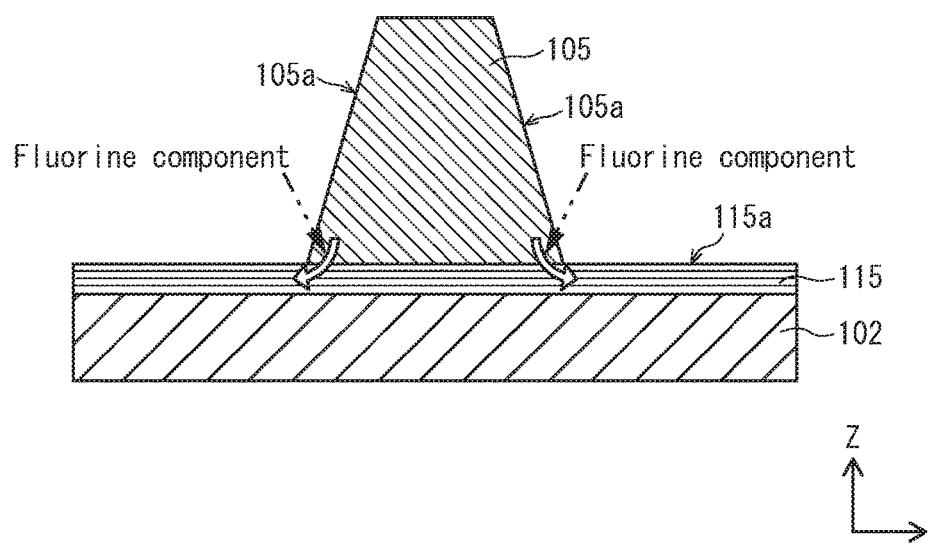
FIG. 7B is a schematic cross-sectional diagram of the area.

The following describes the contact angle of the second banks 115, with reference to FIGS. 7A and 7B.

The present inventor, in cooperation with one or more others, found that the contact angle of a second bank 115 tends to be relatively great at areas of the second bank 115 near where the second bank 115 intersects with first banks 105. In FIG. 7A, such areas are indicated by arrows $E_1$ and $E_2$. That is, the contact angle of a second bank 115 is relatively great at areas near base portions 105b of first banks 105. Due to this, typically, insufficient wetting with ink tended to occur over these areas of second banks 115.

This increase in contact angle of a second bank 115 near a base portion 105b of a first bank 105 is believed to occur due to the baking (Step S7 in FIG. 6) performed after the first banks 105 and the second banks 115 are formed. Specifically, it is believed that the contact angle of a second bank 115 is relatively great near a base portion 105b of a first bank 105 since in the baking, some fluorine components contained in the first bank 105 migrating to the second bank 115 in the baking, as illustrated in FIG. 7B.

Taking into consideration such migration of fluorine components occurring during manufacture, the present embodiment defines that a surface portion 115a of a second bank 115 has a contact angle smaller than that of surface portions 105a of first banks 105 over the entirety of the surface portion 115a, including the areas indicated by arrows $E_1$ and $E_2$ in FIG. 7A. Defining the contact angle of surface portions 115a of second banks 115 in such a manner suppresses the risk of insufficient wetting with ink for forming an organic film, such as the hole transport layer 106 or the organic light-emitting layer 107.

In other words, defining the contact angle of surface portions 115a of the second banks 115 to be smaller than the contact angle of surface portions 105a of the first banks 105 suppresses the risk of insufficient wetting with ink for an organic film without having to excessively increase the quantity of ink droplets applied in the forming of an organic film, such as the hole transport layer 106 or the organic light-emitting layer 107.

[Other Considerations]

1. Consideration of Thickness $H_{115}$ of Second Banks 115

In the present embodiment, the first banks 105 are formed through application after the second banks 115 are formed. Here, due to the second banks 115 having small surface area, a thickness of a portion of a first bank 105 formed over a second bank 115 is at most only half the thickness of portions of the first bank 105 not formed over the second bank 115. This results in the first bank 105 having a relatively small fluorine amount at the portion over the second bank 115, and thus, a surface portion 105a of the first bank 105 having a contact angle smaller than a predetermined contact angle over the second bank 115. When a specific area of a surface portion 105a of a first bank 105 has relatively small contact angle as described above, a situation can be assumed where the area with relatively small contact angle does not retain ink sufficiently and gives rise to ink overflow.

Further, when the thickness $H_{115}$ of the second banks 115 is great (i.e., the second banks 115 have great height), there is a risk of insufficient wetting with ink occurring on the second banks 115.

The present embodiment defines the thickness $H_{115}$ of the second banks 115 as described above taking such matters into consideration.

2. Consideration of Contact Angle of Surface Portions 115a of Second Banks 115

In the present embodiment, the contact angle of surface portions 115a of the second banks 115 is defined to be lower than the contact angle of surface portions 105a of the first banks 105. Typically, exposure to UV radiation is performed in order to increase wettability to ink. However, should contact angle after exposure to UV radiation and baking is not small enough, ink applied on the second banks 115 may be removed upon drying of the ink. When this situation occurs, averaging of pixel ink amounts cannot be achieved. In order to suppress the occurrence of display unevenness, it is significant to average pixel ink amounts. The present embodiment defines the contact angle of surface portions 115a of the second banks 115 to be lower than the contact angle of surface portions 105a of the first banks 105 taking this into consideration.

[Other Matters]

In the embodiment, the present invention is described using a display panel (e.g., display panel 10) as an example of an organic light-emitting device. However, the present invention is not only applicable to a display panel. For example, the structure pertaining to the present invention may be applied to an organic EL lighting device or the like to achieve the same effects as described above.

Further, in the embodiment, the present invention is described using a display panel (e.g., display panel 10) using the active matrix scheme. However, the present invention is not only applicable to a display panel using the active matrix scheme. For example, the structure pertaining to the present invention may be applied to a display panel using the passive matrix scheme to achieve the same effects as described above.

Further, in the embodiment, the contact angle of surface portions (e.g., surface portions 115a) of second banks (e.g., second banks 115) is defined to be 5° or smaller. However, in the present invention, surface portions of second banks may have a contact angle other than this. That is, the contact angle of surface portions of second banks may be set to any contact angle smaller than the contact angle of surface portions (e.g., surface portions 105a) of first banks (e.g., first banks 105). Setting the contact angle of surface portions of second banks in such a manner relative to the contact angle of surface portions of first banks achieves the effects described above.

Further, as illustrated in FIG. 2, etc., a combination of three sub-pixels (e.g., sub-pixels 10a, 10b, and 10c) each having a rectangular shape in plan view composes one pixel in the embodiment. However, the present invention need not have such pixel structure. For example, each sub-pixel of a pixel may have, in plan view, a triangular shape, a hexagonal shape, or an octagonal shape, and/or the sub-pixels may be arranged to form a honeycomb pattern when seen as a whole. Further, each pixel may be composed of four or more sub-pixels. When making such a modification, a configuration may be made such that all sub-pixels composing a pixel emit light of a different color, or a configuration may be made such that some of the sub-pixels composing a pixel emit light of the same color.

Further, in the embodiment, the forming of the first banks (e.g., first banks 105) and the forming of the second banks (e.g., second banks 115) are performed separately. However, the first banks and the second banks may be formed continuously by using the same material, while ensuring that the first banks and the second banks differ from one another in terms surface portion contact angle as described above and that the second banks have the thickness described above.

Further, in the embodiment, the display panel (e.g., display panel 10) is a top-emission-type display panel. However, the present invention also achieves effects similar to those described above when applied to a bottom-emission-type display panel.

INDUSTRIAL APPLICABILITY

The present invention is useful in achieving an organic light-emitting device and an organic display device with high light-emission performance.

The invention claimed is:

1. An organic light-emitting device comprising:

a substrate; and light-emitting portions disposed on or above the substrate in a two-dimensional arrangement in two intersecting directions along a main surface of the substrate, wherein the light-emitting portions, in a first direction intersecting the substrate main surface, each comprise:

a first electrode on or above the substrate;

a charge transport layer on or above the first electrode, the charge transport layer being an organic layer;

an organic light-emitting layer on or above the charge transport layer; and a second electrode on or above the organic light-emitting layer, when defining one of the two directions along the substrate main surface as a second direction and the other one of the two directions as a third direction, an area of each of the light-emitting portions in the second direction is defined by first banks each extending along the substrate main surface and in the third direction, and an area of each of the light-emitting portions in the third direction is defined by second banks each extending along the substrate main surface and in the second direction, each area between a pair of adjacent ones of the first banks is covered by the charge transport layer extending continuously across the area over the second banks and the organic light-emitting layer extending continuously across the area over the second banks, and the first banks and the second banks each contain an insulating material, a thickness of the second banks is no greater than 20% a height of the first banks, and a contact angle of surface portions of the second banks is smaller than a contact angle of surface portions of the first banks.

2. The organic light-emitting device of claim 1, wherein an end portion of the first electrode has a flat area extending along the substrate main surface, the second banks have a portion covering the flat area of the first electrode, and the thickness of the second banks is a thickness of the portion covering the flat area of the first electrode.

3. The organic light-emitting device of claim 1, wherein the contact angle of surface portions of the second banks is a contact angle with respect to ink for forming the charge transport layer.

4. The organic light-emitting device of claim 1, wherein the thickness of the second banks is 800 nm or smaller.

5. The organic light-emitting device of claim 1, wherein the contact angle of surface portions of the second banks is 5° or smaller.

6. An organic display device comprising:

a display panel; and a control and drive circuit unit that is connected to the display panel, wherein the display panel has the device structure of the organic light-emitting device of claim 1.

* * * * *